United States Patent
Babkin et al.

(10) Patent No.: US 11,870,575 B2
(45) Date of Patent: Jan. 9, 2024

(54) SYSTEMS AND METHODS FOR ERROR DETECTION IN TRANSMITTED VIDEO DATA

(71) Applicant: Google LLC, Mountain View, CA (US)

(72) Inventors: Sergey Anatolyevich Babkin, Woodinville, WA (US); Myles Jordan, Snohomish, WA (US)

(73) Assignee: GOOGLE LLC, Mountain View, CA (US)

( * ) Notice: Subject to any disclaimer, the term of this patent is extended or adjusted under 35 U.S.C. 154(b) by 21 days.

(21) Appl. No.: 16/867,317

(22) Filed: May 5, 2020

(65) Prior Publication Data
US 2021/0351867 A1 Nov. 11, 2021

(51) Int. Cl.
| | | |
|---|---|---|
| *H04N 19/65* | (2014.01) | |
| *H04N 19/89* | (2014.01) | |
| *H04N 19/67* | (2014.01) | |
| *H04L 1/00* | (2006.01) | |
| *H04N 9/89* | (2006.01) | |
| *H03M 13/09* | (2006.01) | |
| *H04N 21/6375* | (2011.01) | |
| *H04L 65/65* | (2022.01) | |
| *H04L 65/70* | (2022.01) | |

(52) U.S. Cl.
CPC .......... *H04L 1/0061* (2013.01); *H03M 13/09* (2013.01); *H04L 65/65* (2022.05); *H04L 65/70* (2022.05); *H04N 9/89* (2013.01); *H04N 19/65* (2014.11); *H04N 21/6375* (2013.01)

(58) Field of Classification Search
None
See application file for complete search history.

(56) References Cited

U.S. PATENT DOCUMENTS

| | | | | |
|---|---|---|---|---|
| 8,391,370 B1 * | 3/2013 | Mukherjee | ............. | H04N 19/33 375/240.24 |
| 2015/0071353 A1 * | 3/2015 | Nilsson | ................ | H04N 19/503 375/240.12 |
| 2015/0326884 A1 * | 11/2015 | Bae | ...................... | H04N 19/182 375/240.27 |

(Continued)

OTHER PUBLICATIONS

International Search Report and Written Opinion Application No. PCT/US2021/030865, dated Sep. 15, 2021, 19 pages.

(Continued)

*Primary Examiner* — Samuel D Fereja
(74) *Attorney, Agent, or Firm* — Dority & Manning, P.A.

(57) ABSTRACT

Systems and methods for error detection in video data is described. An encoding computing system can receive a video frame. The encoding computing system can encode and decode the video frame based on an encoding scheme. The encoding computing system can generate a frame error detection code for the decoded video frame based on an error detection code generation scheme. The encoding computing system can send the encoded video frame and the error detection code to a decoding computing system. The decoding computing system can decode the encoded video frame and generate a second error detection code using the code generation scheme. The decoding computing system can detect that the decoded video frame is corrupted by comparing the error detection code and the second error detection code.

18 Claims, 6 Drawing Sheets

(56) References Cited

U.S. PATENT DOCUMENTS

2016/0173898 A1    6/2016  Samuelsson et al.
2017/0249521 A1*  8/2017  Brice ..................... G06V 10/50
2021/0160480 A1*  5/2021  Zhao .................... H04N 19/107

OTHER PUBLICATIONS

Boyce et al., "Supplemental enhancement information messages for coded video bitstreams (Draft 4)," MPEG Meeting, May 3, 2020.

\* cited by examiner

SYSTEMS AND METHODS FOR ERROR DETECTION IN TRANSMITTED VIDEO DATA

FIELD

The present disclosure relates generally to detecting errors in transmitted video frame data. More particularly, the present disclosure relates to systems and methods for detecting corruption in decoded video frame data with error detection coding.

BACKGROUND

The transmission of video data requires a complex and error-prone sequencing of data at both sending, receiving, and/or intermediate computing systems. As an example, a real-time transport protocol packet requires the correct processing and updating of a number of components in a specified order (e.g., timestamp, packet sequence id, frame sequence id, inter-frame dependency list, etc.). As such, any processing error can lead to a sequence of video packets (e.g., video frame(s), etc.) that are decodable by the decoding computing system but include visible corruption.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method for error detection in video data. The method can include receiving, by a decoding computing system comprising one or more computing devices, an encoded video frame and an associated first frame error detection code. The first frame error detection code can be generated by an encoding computing system by applying an error detection code generation scheme to a first decoded video frame. The first decoded video frame can include a decoding of the encoded video frame produced at the encoding computing system. The method can include decoding, by the decoding computing system, the encoded video frame to obtain a second decoded video frame. The method can include applying, by the decoding computing system, the error detection code generation scheme to the second decoded video frame to generate a second frame error detection code. The method can include determining, by the decoding computing system, error data describing one or more differences between the first frame error detection code and the second frame error detection code. The method can include determining, by the decoding computing system based on the error data exceeding one or more error thresholds, that the encoded video frame is a corrupted video frame.

Another example aspect of the present disclosure is directed to an encoding computing system. The computing system can include one or more processors. The computing system can include one or more tangible, non-transitory, computer readable media that collectively store instructions that when executed by the one or more processors cause the encoding computing system to perform operations. The operations can include receiving a video frame from a video frame capture device. The operations can include encoding the video frame according to an encoding scheme to produce an encoded video frame. The operations can include generating a frame error detection code for the video frame based on intermediate encoding data produced via performance of the encoding scheme. The operations can include sending the encoded video frame and the frame error detection code to a decoding computing system.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Reference numerals that are repeated across plural figures are intended to identify the same features in various implementations.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to systems and methods for detecting errors in video communicated between computing systems. More particularly, the present disclosure is directed to utilizing post-decoding error detection code verification on both encoding and decoding computing systems to properly ensure that transmitted video files are uncorrupted. As an example, an encoding computing system can receive a captured video frame (e.g., a single frame of a captured video file, etc.) and encode the video file according to an encoding scheme. The encoding computing system can then decode the video file and generate a frame error detection code based on the decoded video frame (e.g., using an error detection code generation scheme, etc.). The encoding computing system can send the encoded video frame and the frame error detection code to a decoding computing system (e.g., using a real-time transport protocol packet and associated extension field, etc.). The decoding computing system can decode the encoded video frame according to the encoding scheme to generate an additional frame error detection code. The decoding computing system can then compare the two frame error detection codes to determine if the decoded video frame is corrupted (e.g., based on detected errors, etc.). In such fashion, both the encoding computing system and decoding computing system can generate error detection codes from a decoding of the encoded frame, therefore allowing for the precise detection and evaluation of any corruption present in the video frame.

More particularly, the transmission of video data necessitates a complex and error-prone sequencing of data at both sending and receiving computing systems. As an example, a real-time transport protocol packet requires the correct processing and updating of a number of components in a specified order (e.g., timestamp, packet sequence id, frame sequence id, inter-frame dependency list, etc.). As such, any processing error can lead to a sequence of video packets (e.g., video frame(s), etc.) that are decodable by the decoding computing system but include visible corruption. However, the detection of video frame corruption can be difficult, and often requires the transmission of both the original and the processed (e.g., encoded) video frame to the receiving computing system, leading to inefficient usage of network and storage resources.

In response to these inefficiencies, the present disclosure proposes a method to detect errors in transmitted video frame data. More particularly, an encoding computing system can receive a video frame from a video frame capture device (e.g., a camera, webcam, associated capture device, etc.). The video frame can, in some implementations, be one video frame of a plurality of video frames captured by the video frame capture device. Alternatively, or additionally, in some implementations, the video frame can include the video frame at a plurality of different resolutions.

The encoding computing system can encode the video frame according to an encoding scheme to produce a first encoded video frame. The encoding scheme can be any arbitrary video encoding scheme (e.g., MPEG, AVI, etc.). In some implementations, the first encoded video frame can be a compressed representation of the video frame.

The encoding computing system can decode the encoded video frame according to a decoding scheme corresponding to the encoding scheme to obtain a first decoded video frame. More particularly, the encoding computing system can decode the encoded frame to generate a first decoded video frame that is a decoded representation of the video frame. In some implementations, if the encoding scheme is a lossy encoding scheme, the decoded video frame may differ from the video frame (e.g., artifacting from the lossy compression scheme, etc.).

The encoding computing system can apply an error detection code generation scheme to the first decoded video frame to generate a first frame error detection code. More particularly, the encoding computing scheme can generate a first frame error detection code for the first decoded video frame by utilizing any arbitrary error detection coding technique (e.g., MD5, SHA-1, cyclic redundancy checks, perceptual hashing algorithm(s), deterministic downscaling algorithm(s), etc.). In some implementations, the first frame error detection code can be a downscaled representation of the first decoded video frame. As an example, the first decoded video frame can be downscaled by the encoding computing system (e.g., to a 16×16 pixel representation, etc.). The downscaled representation of the first decoded video frame can be utilized as the first frame error detection code.

The encoding computing system can send the first encoded video frame and the first frame error detection code to a decoding computing system. In some implementations, the encoding computing system can send the first encoded video frame and the first frame error detection code to the decoding computing system via a network (e.g., internet, local area network, etc.). In some implementations, the first frame error detection code and the first encoded video frame can be sent to the decoding computing system using a real-time transport protocol. As an example, the first encoded video frame can be packaged as one or more real-time transport protocol packets, while the first frame error detection code can be packaged in the extension fields of the one or more real-time transport protocol packets. In such fashion, the first encoded video frame and the first frame error detection code can arrive at the decoding computing system concurrently.

The decoding computing system can receive the first encoded video frame and the first frame error detection code. Using the same or a substantially similar encoding and/or decoding scheme as the encoding computing system, the decoding computing system can decode the first encoded video frame to obtain a second decoded video frame. In some implementations, the second decoded video frame can be identical or substantially similar to the first decoded video frame generated at the encoding computing system. Alternatively, in some implementations, the second decoded video frame can differ substantially from the first encoded video frame (e.g., due to data corruption, etc.).

The decoding computing system can apply the error detection code generation scheme used by the encoding computing system to the second decoded video frame to generate a second frame error detection code. In some implementations, the decoding computing system can, in the same manner as the encoding computing system, downscale the second decoded video frame (e.g., to a 16×16 pixel representation, etc.) to generate a downscaled second decoded video frame. In such fashion, differences between the downscaled first decoded video frame and the downscaled second decoded video frame will spatially correspond to corrupt locations of the second decoded video frame.

The decoding computing system can determine error data describing one or more differences between the first frame error detection code and the second frame error detection code. More particularly, the decoding computing system can determine error data by evaluating a difference by comparing the first frame error detection code and the second frame error detection code. As mentioned previously, if the first and second frame error detection codes are respectively generated by downscaling the first and second decoded video frames, the error detection codes can be compared to determine a spatial location of one or more corruptions visibly present in the second decoded video frame. As such, the error data can, in some implementations, include a location of one or more errors in the second decoded video frame. Additionally, or alternatively, in some implementations, the error data can include a number of pixels associated with an error. As an example, a comparison of the first and second frame error detection codes can determine that a difference exists in the top-left location of the first and second decoded video frames. The error data can include this location and can also include a number of pixels associated with the difference between the decoded video frames.

The decoding computing system can determine, based on the error data exceeding one or more error thresholds, that the encoded video frame is a corrupted video frame. More particularly, the decoding computing system can determine that there are a number and/or severity of error(s) associated with the differences between the first and second video frame such that the encoded video frame is corrupted. As an example, an error threshold may specify that exceeding a certain number of errors indicates that the encoded video frame is corrupted. As another example, the error threshold may specify that exceeding a certain number of pixel differences indicates that the encoded video frame is corrupted. The error threshold can be any arbitrary threshold associated with a severity and/or number of errors in the encoded video frame.

In some implementations, the original captured video frame can describe a difference between the current frame and a previously captured frame. More particularly, the video frame can include data that describes any changes to the scene depicted by the previous frame. As an example, the previous video frame can include a person sitting behind a static background. After the previous video frame is captured, the person can move slightly, and the static background can stay the same. The current video frame can depend on the previous video frame by only including data that depicts the new position of the person in the frame and the decoder (e.g., decoding computing system, etc.) can fill the rest of the current frame in with the data included in the previous frame (e.g., the static background, etc.). In such fashion, the video frame(s) can depend upon previously transmitted frame(s) to utilize substantially less data by only including changes to the depicted scene while utilizing previously captured data that has not yet changed. In some implementations, the unchanged data (e.g., data depicting a static background, etc.) from previous frame(s) can be utilized during decoding in conjunction with the encoded video frame to generate the decoded video frame.

In some implementations, the error detection code generation scheme can incorporate one or more references to previous image frames received before the original video frame. More particularly, the error detection code can include the data of the current video frame and any previous dependent video frames (e.g., the full data of the current decoded video frame, etc.). As such, the error detection code can be used to determine a dependency failure between video frames. As an example, a video frame B can depend on a previous video frame A. The error code generation scheme can be applied to the first decoded video frame to generate a first error detection code. The first error detection code can be based on the current video frame B and the previous video frame A. The first error detection code and the encoded video frame can be sent to a decoding computing system. The decoding computing system can decode the encoded video frame based on an incorrect dependency (e.g., depending from a previous frame C instead of the previous frame A, etc.). For example, a multiplexing video stream switch may lead to the decoding computing system utilizing a wrong key frame for frame dependency. The decoding computing system can generate a second error detection code from the decoded video frame and compare the first and second error detection codes. Based on the differences between the codes, the computing system can determine that the second decoded video frame depended from an incorrect previous frame. In such fashion, the error detection code generation scheme can be utilized to detect errors stemming from incorrect frame dependencies rather than transmission errors (e.g., missing data, etc.).

In response to determining that the encoded video frame is a corrupted video frame, the decoding computing system can, in some implementations, generate logging data. The logging data can include the corrupted video frame, the encoded video frame, the second decoded video frame, metadata associated with the corrupted video frame, the error data describing the one or more differences, or any other arbitrary data associated with the video frame data. Additionally, or alternatively, in some implementations, the decoding computing system can generate a logging request and send the logging request to the encoding computing system. The logging request can include instructions to generate logging data that includes the same or similar data as the logging data generated by the decoding computing system.

In some implementations, the decoding computing system can generate a request for a replacement frame after determining that the encoded video frame is corrupt. The request for the replacement frame can be sent to the encoding computing system. In response, the encoding computing system can generate a replacement video frame by re-encoding the video frame with the encoding scheme. Alternatively, in some implementations, the encoding computing system can generate the replacement video frame by re-encoding the video frame with a different encoding scheme. In such fashion, the replacement data may avoid corruption effects associated with a certain encoding scheme.

In some implementations, the decoding computing system can generate a stream restart request. More particularly, when the encoding computing system is transmitting a sequence of video frames for sequential, real-time display (e.g., a video stream, etc.), the decoding computing system, in response to determining that the encoded video frame is corrupt, can generate a stream restart request. The stream restart request can include instructions for the encoding computing system to stop transmitting a current video stream and begin to transmit a new stream starting at a video frame subsequent to the corrupted video frame. In such fashion, the decoding computing system can quickly receive a new stream that is free of any downstream frame corruption errors resulting from the corrupted video frame.

The present disclosure provides a number of technical effects and benefits. As one example technical effect and benefit, the systems and methods of the present disclosure enable the detection of corruption in transmitted (e.g., multiplexed, packetized, depacketized, etc.) video frame data. More particularly, the present disclosure can quickly and efficiently detect the severity and/or spatial location of corruption in decoded video frame data. Additionally, the present disclosure can perform this detection without requiring the transmission of both the video frame data and the encoded video frame data to the decoding computing system. By avoiding this requirement, the present disclosure significantly reduces network bandwidth usage, storage usage, and processing power associated with video file transmission.

With reference now to the Figures, example embodiments of the present disclosure will be discussed in further detail.

Figure 1:
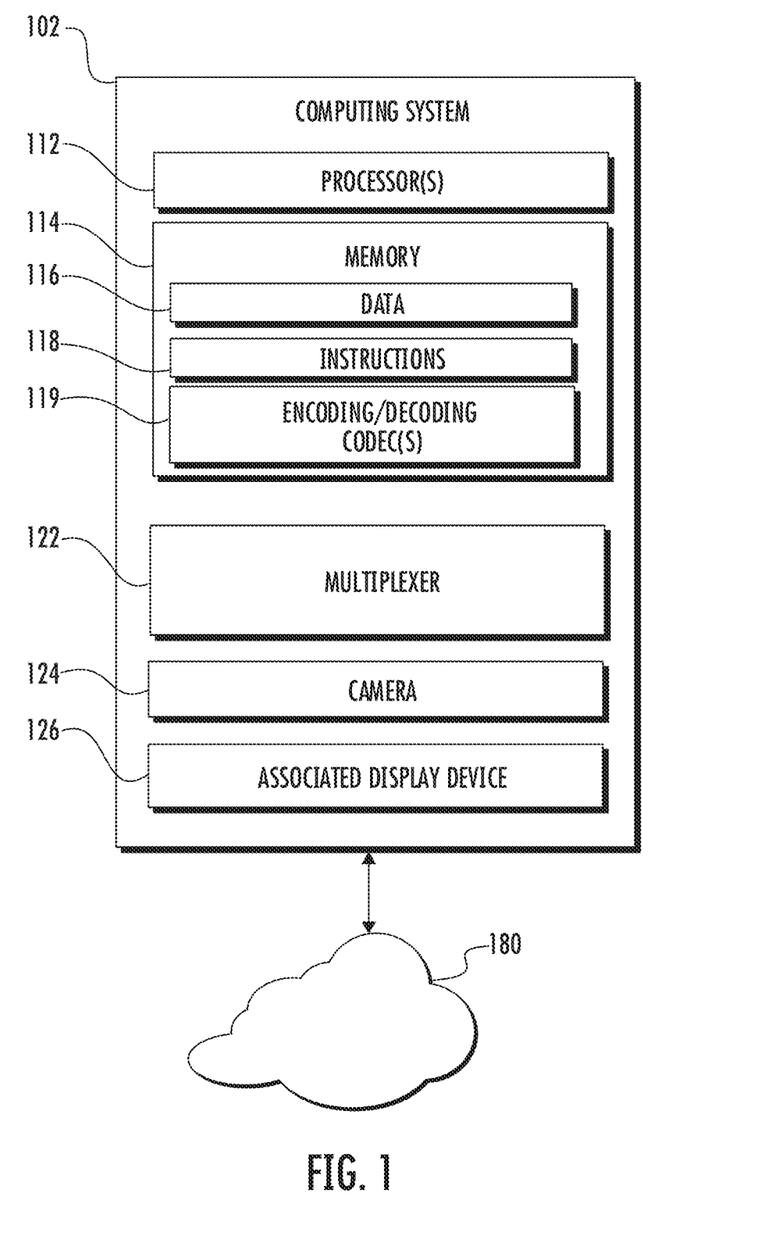
FIG. 1 depicts a block diagram of example computing systems according to example embodiments of the present disclosure

FIG. 1 depicts example computing system 102 in an example video streaming environment 100 according to example embodiments of the present disclosure. The video streaming environment 100 includes a computing system 102 that is connected by and communicates through a network 180.

In some example embodiments, the computing system 102 can be any suitable device, including, but not limited to, a smartphone, a tablet, a laptop, a desktop computer, or any other computer device that is configured such that it can allow a user to participate in a video conference. The computing system 102 can include one or more processor(s) 112, memory 114, a multiplexer 122, a camera 124, and an associated display device 126.

It should be noted that the computing system 102 can act as an encoding and/or decoding computing system of the present embodiments. More particularly, the computing system 102 can act as an encoding computing system by receiving video frame data from the camera 124 and encoding the video frame before transmitting the video frame to a secondary decoding computing system through the network 180. Similarly, the computing system 102 can act as a decoding computing system by receiving an encoded video frame from an encoding computing system through the network 180 and can subsequently decode the encoded video frame and detect errors in the encoded video frame. In such fashion, the computing system 102, as depicted, can represent an encoding computing system, a decoding computing system, or both an encoding and decoding computing system.

The one or more processor(s) 112 can be any suitable processing device, such as a microprocessor, microcontroller, integrated circuit, or other suitable processing device. The memory 114 can include any suitable computing system or media, including, but not limited to, non-transitory computer-readable media, RAM, ROM, hard drives, flash drives, or other memory devices. The memory 114 can store information accessible by the one or more processor(s) 112, including instructions that can be executed by the one or more processor(s) 112. The instructions can be any set of instructions that when executed by the one or more processor(s) 112, cause the one or more processor(s) 112 to provide the desired functionality.

In particular, in some devices, memory 114 can store instructions for encoding and decoding video frame data and applying error detection code generation scheme(s) to video frame data. The computing system 102 can implement the instructions to execute aspects of the present disclosure, including receiving captured video frame(s) from the camera 124, encoding video frame data, decoding video frame data, applying error detection code generation schemes to video frame data, sending and/or receiving encoded video frames and/or error detection codes to encoding and/or decoding computing systems via network 180, or any other operations associated with implementations of the present embodiments.

It will be appreciated that the term "system" can refer to specialized hardware, computer logic that executes on a more general processor, or some combination thereof. Thus, a system can be implemented in hardware, application specific circuits, firmware, and/or software controlling a general-purpose processor. In one embodiment, the systems can be implemented as program code files stored on a storage device, loaded into memory and executed by a processor or can be provided from computer program products, for example computer executable instructions, that are stored in a tangible computer-readable storage medium such as RAM, hard disk, or optical or magnetic media.

Memory 114 can also include data 116, such as video frame data (e.g., captured at the computing system 102 or received via the network 180), that can be retrieved, manipulated, created, or stored by the one or more processor(s) 112. In some example embodiments, such data can be accessed and displayed to one or more users of the computing system 102 after decoding on an associated display device 126.

More particularly, the memory 114 can include encoding/decoding codec(s) 119. The codec(s) 119 can be any arbitrary encoding and/or decoding scheme for video frame data, image data, or any other data utilized by the system. As an example, the codec(s) 119 may include conventional video frame processing codec(s) (e.g., AVI, MOV, MPEG, etc.). As another example, the codec(s) 119 may additionally include error detection code generation scheme(s) associated with the codec(s) 119. For example, the codec(s) 119 may include conventional error detection code generation scheme(s) such as conventional checksum algorithm(s) (e.g., CRC, etc.). For another example, the codec(s) 119 may include other types of error detection code generation scheme(s) (e.g., perceptual hashing algorithm(s), deterministic downscaling algorithm(s), etc.).

In some implementations, the computing system 102 can receive captured video frame data from the camera 124. The camera 124 can be hardware integrated with the computing system 102 or can be a video capture device communicatively coupled to the computing system 102 (e.g., a webcam, video recording device, etc.). The computing system 102 can encode a video frame of the video frame data according to an encoding scheme to produce an encoded video frame. The computing system 102 can decode the encoded video frame according to a decoding scheme that corresponds to the encoding scheme to obtain a decoded video frame. The computing system 102 can apply an error detection code generation scheme to the decoded video frame to generate a frame error detection code. The computing system 102 can send the encoded video frame and the frame error detection code to a secondary computing system (e.g., a decoding computing system, etc.) via the network 180 (e.g., using a real-time transport protocol packet, etc.).

In some implementations, the computing system 102 can package the encoded video frame and the frame error detection code before sending the package via network 180. More particularly, the computing system 102 can package the encoded video frame and the frame error detection code in a transmission package. In some implementations, the transmission package can be one or more real-time transport protocol packets. The encoded video frame can be included in the packet(s) and the frame error detection code can be included in one or more respective extension fields of the one or more real-time transportation protocol packets. The transmission package can be transmitted to a secondary computing system via network 180.

Alternatively, or additionally, in some implementations the computing system 102 can receive an encoded video frame and an associated first frame error detection code via network 180 (e.g., from a secondary computing system, etc.). More particularly, the computing system 102 can, in some implementations, receive a transmission package. The transmission package can include one or more real-time transportation protocol packets that include the encoded video frame and an associated first frame error detection code in the extension field(s) of the packet(s). The transmission package can be separated into the encoded video frame and the first frame error detection code (e.g., using a packetizer to depacketize the transmission package, etc.).

The computing system 102 can decode the encoded video frame to obtain a decoded video frame. The computing system 102 can apply an error detection code generation scheme to the decoded video frame to generate a second frame error detection code. The computing system 102 can determine error data that describes one or more differences between the frame error detection code and the second frame error detection code. If the error data exceeds one or more error thresholds, the computing system 102 can determine that the encoded video frame is a corrupted video frame.

In some implementations, the computing system 102 can perform operations in response to determining that the encoded video frame is a corrupted video frame. As an example, the computing system 102 can generate logging data (e.g., stored in memory 114) that can include the corrupted video frame, the decoded video frame, metadata associated with the corrupted video frame, and/or any other data associated with the de-packetizing of the transmission package. As another example, the computing system 102 can send a replacement frame request via network 180 to the secondary computing system that initially sent the transmission package. In response, the computing system can receive a replacement encoded video frame and can subsequently attempt to decode the replacement video frame.

In some implementations, the computing system 102 can generate a stream restart request. More particularly, when the computing system 102 is receiving a sequence of video frames for sequential, real-time display (e.g., a video stream, etc.), the computing system 102, in response to determining that the encoded video frame is corrupt, can generate a stream restart request. The stream restart request can include instructions for the transmitting computing system to stop transmitting a current video stream and begin to transmit a new stream starting at a video frame subsequent to the corrupted video frame. In such fashion, the computing system 102 can quickly receive a new stream that is free of any downstream frame corruption errors resulting from the corrupted video frame.

Additionally, or alternatively, in some implementations, the computing system 102 can determine that the corrupted video frame is below one or more corruption thresholds. If the corrupted video frame is below the one or more corruption thresholds, the computing system 102 can determine that the corrupted video frame is suitable for display. As an example, the computing system can determine to provide the corrupted video frame to another computing device or computing system via network 180. As another example, the computing system 102 can determine to display the corrupted video frame via associated display device 126.

The network 180 can be any type of communications network, such as a local area network (e.g., intranet), wide area network (e.g., Internet), or some combination thereof. In general, communication between the computing system 102 and the server computing system 130 can be carried via network interface using any type of wired and/or wireless connection, using a variety of communication protocols (e.g., TCP/IP, HTTP), encodings or formats (e.g., HTML, XML), and/or protection schemes (e.g., VPN, secure HTTP, SSL).

Figure 2:
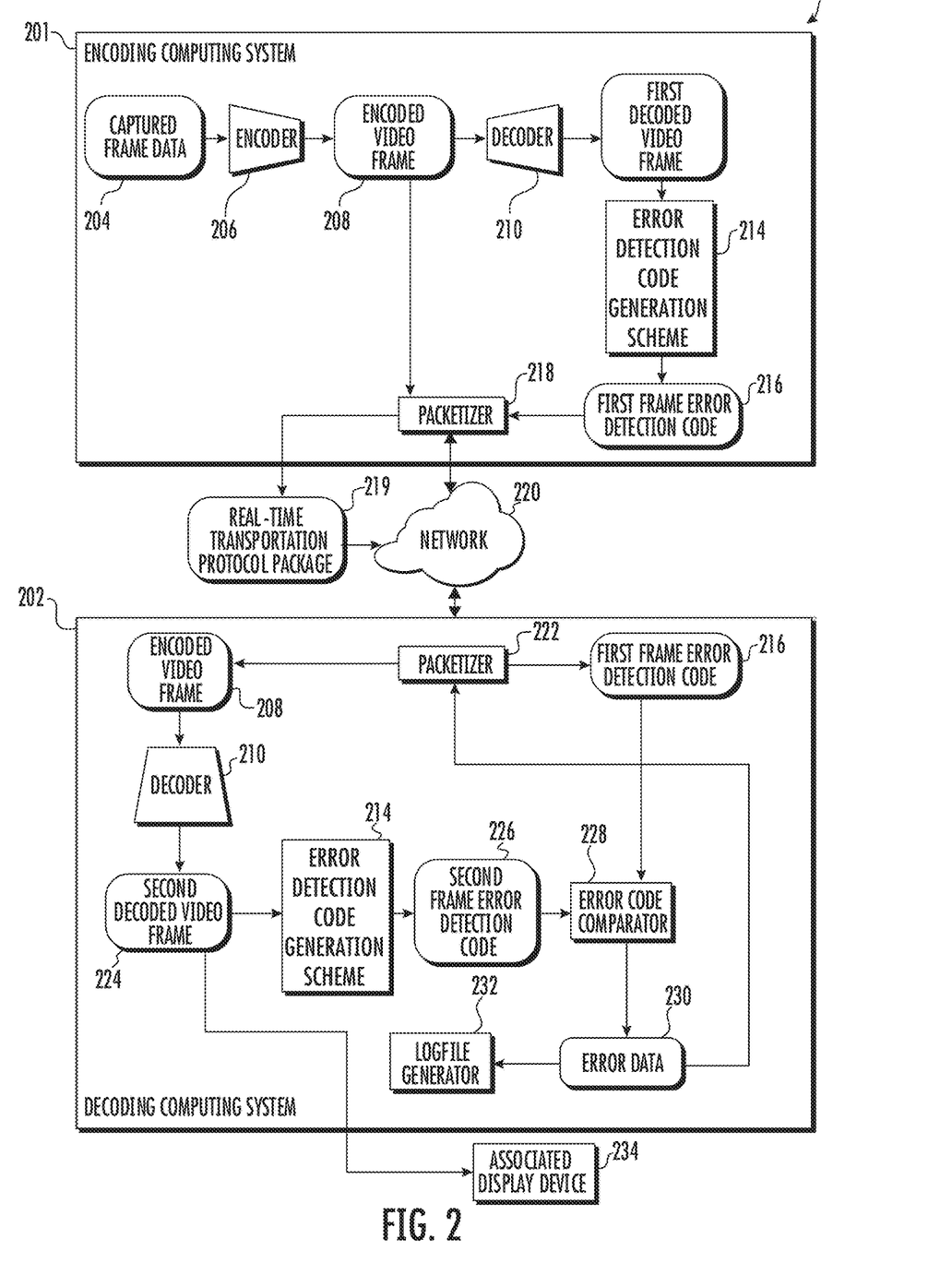
FIG. 2 depicts a flow diagram for detecting corruption errors in transmitted video frame data according to example embodiments of the present disclosure.

FIG. 2 depicts a flow diagram for detecting corruption errors in transmitted video frame data according to example embodiments of the present disclosure. More particularly, the encoding computing system 201 can receive captured frame data 204 (e.g., from an associated video frame capture device such as a camera, etc.). The captured frame data can include one or more video frames. A video frame of the captured frame data 204 can be input into the encoder 206 to receive an encoded video frame 208. The encoder 206 can, in some implementations, represent the application of any arbitrary encoding scheme. As an example, the encoder 206 may represent the application of a conventional video encoding scheme such as MPEG, AVI, etc.

The encoded video frame can be sent to the decoder 210 to receive a first decoded video frame 212. The decoder 210, like the encoder 206, can represent the application of a decoding scheme to the encoded video frame. The decoder 210 (e.g., the applied decoding scheme) can correspond to the encoding scheme used at the encoder 206. More particularly, the decoder 210 can utilize the same encoding scheme as the encoder 206 to decode the encoded video frame 208 and produce the first decoded video frame 212. In some implementations, if the encoding scheme used at the encoder 206 is lossy (e.g., a lossy compression algorithm, etc.) the first decoded video frame 212 can be a lossy representation of the video frame from the captured frame data 204.

An error detection code generation scheme 214 can be applied to the first decoded video frame 212. The error detection code generation scheme can be any arbitrary hashing and/or checksum scheme. As an example, the error detection code generation scheme may be or otherwise include a conventional checksum generation scheme, such as CRC, Fletcher's checksum, Adler-32, etc. Alternatively, in some implementations, the error detection code generation scheme can be another form of hashing operation, such as a perceptual hashing algorithm and/or a deterministic downscaling algorithm. As an example, a downscaling perceptual hashing algorithm can be applied to the first decoded video frame. For example, the first decoded video frame 212 can be downscaled to a very small representation using a deterministic perceptual hashing algorithm (e.g., downscaling a 1920×1080 pixels to a 16×16 pixel representation, etc.). The downscaled decoded video frame can be utilized as a first frame error detection code 216. The application of a perceptual hashing algorithm as the error detection code generation scheme will be discussed in greater detail with regards to FIG. 3.

By applying the error detection code generation scheme 214 to the first decoded video frame 212, the encoding computing system can generate a first frame error detection code 216. The code can be any sort of code specified by the error detection code generation scheme 214. As an example, if the error detection code generation scheme 214 is a conventional checksum hashing algorithm, the first frame error detection code 216 may be or otherwise include a discrete string of values. Alternatively, if the error detection code generation scheme 214 is a perceptual hashing algorithm, the first frame error detection code 216 may be a downscaled representation of the first decoded video frame 212.

The first frame error detection code 216 can be sent to the packetizer 218. The packetizer 218 can be any sort of arbitrary hardware and/or software packetizer. As an example, the packetizer 218 can be a physical hardware packetizer integrated into or communicatively coupled to the encoding computing system 201. As another example, the packetizer 218 may be a virtualized packetizer executed by one or more processors of the encoding computing system 201 (e.g., the processors 112 of FIG. 1). It should be noted that in some implementations, the packetizer 218 can be or otherwise include an additional multiplexer with different functionality. As an example, a multiplexer of the packetizer 218 can be configured to replace a first video frame with a second video frame at a different resolution, as described previously. Further, a multiplexer of packetizer 218 can be utilized to multiplex the first frame error detection code 216 and the encoded video frame 208. In such fashion, the encoding computing system can utilize any configuration and/or number of physical and/or virtualized multiplexer(s) 218 to perform the described functionality of the present embodiments.

The packetizer 218 can receive the encoded video frame 208 and the first frame error detection code 216. The packetizer 218 can package the encoded video frame 208 and the first frame error detection code 216 and transmit both over the network 220. More particularly, in some implementations, the packetizer 218 can package the encoded video frame 208 and the first frame error detection code 216 as a real-time transportation protocol package 219. The real-time transportation protocol package 219 can include one or more real-time transportation protocol packets, and the real-time transportation protocol package 219 can include the encoded video frame 208. Additionally, the first frame error detection code 216 can be included in an extension field of the real-time transportation protocol package 219. Alternatively, in some implementations, the transmission package can utilize any other sort of transmission protocol when sending the transmission package via the network 220.

In some implementations, the network 220 can include a server which intermediates between the encoding computing system 201 and the decoding computing system 202. More particularly, in implementations in which multiple video frames at multiple resolutions are individually processed (e.g., encoded, hashed, etc.) and then multiplexed at the encoding computing system 201, the server of the network 220 can select some subset of such encoded frames (e.g., one, two, etc.) for transmission to the decoding computing system 202 (e.g., based on network connection statistics regarding decoding computing system 202's connection to the network 220, etc.). In such fashion, an intermediary computing system(s) can be or otherwise include multiplexers which can be configured to select a video frame from a plurality of video frames at multiple resolutions.

It should be noted that the process depicted in the encoding computing system 201 can, in some implementations, be performed in parallel for multiple different image frames at multiple different image resolutions. As an example, multiple captured frame data 204 can be processed to generate encoded video frames and associated error detection codes in parallel. In some implementations, each of the multiple encoded video frames and associated error detection codes can be packetized into one or more transmission packages (e.g., packetized by packetizer 218 into a real-time transportation protocol package 219, etc.).

The encoding computing system 201, using the packetizer 218, can send the encoded video frame 208 and the first frame error detection code 216 (e.g., packaged in a transmission package, etc.) to the decoding computing system 202. The decoding computing system 202 can receive the encoded video frame 208 and the first frame error detection code 216 via the network 220 and can use the packetizer 222 to separate (e.g., depacketize) the encoded video frame 208 and the first frame error detection code 216. The decoding computing system 202 can send the encoded video frame 208 to the decoder 210 to obtain a second decoded video frame 224. The decoder 210 can be the same decoder as the decoder 210 of the encoding computing system 201. The second decoded video frame 224 can, in some circumstances, be the same decoded video frame as the first decoded video frame 212. However, as depicted, the second decoded video frame 224 can have one or more associated errors.

It should be noted that the packetizers 218/222 can perform both packetizing and depacketizing operations. More particularly, the packetizer 218 can both packetize (e.g., package into a transmission package, etc.) first frame error detection code 216 and error detection code generation scheme 214 and depacketize the transmission package into the respective components. Similarly, the packetizer 220 can perform both packetizing operations and depacketizing operations the same manner as the packetizer 218. In such fashion, both packetizers can be utilized for sending and receiving operations (e.g., in conjunction with a network 220, etc.).

The error detection code generation scheme 214 can be applied to the second decoded video frame 224. The error detection code generation scheme 214 can be the same scheme as the error detection code generation scheme applied by the encoding computing system 201. By applying the error detection code generation scheme 214, the decoding computing system 202 can generate a second frame error detection code 226. The second frame error detection code 226 can be a hash representation of the second decoded video frame 224, and can be generated in the same manner as the first frame error detection code 216.

The second frame error detection code 226 and the first frame error detection code 216 can be compared by the decoding computing system 202 at the error code comparator 228. More particularly, the decoding computing system 202 can determine (e.g., with via code comparator 228) error data 230 that describes one or more differences between the first frame error detection code 216 and the second frame error detection code 226. The one or more differences can describe corruption errors present in the second decoded video frame 224. In some implementations, if the error detection code generation scheme 214 is a certain type of hashing algorithm (e.g., a perceptual hashing algorithm, a deterministic downscaling algorithm, etc.), the error data can describe the spatial locations of one or more differences and/or the number of pixels associated with the one or more differences. As an example, the first and second error detection codes 216/226 can both respectively be downscaled pixel representations of the first and second decoded video frames 212/224. The second decoded video frame 224 can be corrupted (e.g., one or more pixel errors) in the top right corner of the frame. By comparing the downscaled pixel representations (e.g., the first and second error detection codes 216/226), the decoding computing system 202 can determine a spatial location of one or more errors by determining the spatial location of a difference between the downscaled pixel representations. Additionally, or alternatively, in some implementations the decoding computing system 202 can determine the number of pixels associated with the difference between the downscaled pixel representations. In such fashion, the decoding computing system 202 can quickly and efficiently determine a location and severity of one or more differences (e.g., errors, etc.) and include the information in the error data 230.

The decoding computing system 202 can determine that the error data exceeds one or more error thresholds. The error thresholds can correspond to the information stored in the error data. As an example, the error threshold(s) may describe a certain threshold severity level of a difference between the decoded video frames (e.g., a number of affected pixels, etc.). As another example, the error threshold(s) may describe a certain threshold number of differences between the decoded video frames. As yet another example, the error threshold(s) may describe one or more difference location thresholds for the differences between the video frames.

Based on the error data 230 exceeding the one or more error thresholds, the decoding computing system 202 can determine that the encoded video frame is a corrupted video frame. More particularly, the decoding computing system 202 can determine that the encoded video frame 208 possesses a certain level of corruption. Based on this determination, the decoding computing system can, in some implementations, generate logging data via logfile generator 232. The logging data can include one or more preceding encoded video frames received from the encoding computing system 201 prior to receipt of the encoded video frame 208. Additionally, or alternatively, in some implementations, the logging data can include the corrupted video frame (e.g., encoded video frame 208 and/or second decoded video frame 224), metadata associated with the corrupted video frame, or the error data 230.

In some implementations, the decoding computing system can, based on the error data exceeding the error threshold(s), send a replacement frame request to the encoding computing system 201. In response, the decoding computing system 202 can receive a replacement encoded video frame from the encoding computing system 201. The replacement encoded video frame can be a re-encoding of the video frame from the captured frame data 204. In some implementations, the replacement encoded video frame can include a key frame.

In some implementations, the decoding computing system 202 can send a logging request to the encoding computing system 201. The logging request can include instructions for the encoding computing system 201 to generate logging data (e.g., via a logfile generator, etc.) that includes at least some of the data included in the logging data by the decoding computing system (e.g., the encoded video frame 208, etc.).

In some implementations, the decoding computing system 202 can determine that the corrupted video frame is below a corruption threshold. The corruption threshold can describe a threshold level of corruption associated with the corrupted video frame. In response to this determination, the decoding computing system 202 can provide the corrupted video frame (e.g., the second decoded video frame 224) for display to associated display device 234.

Figure 3:
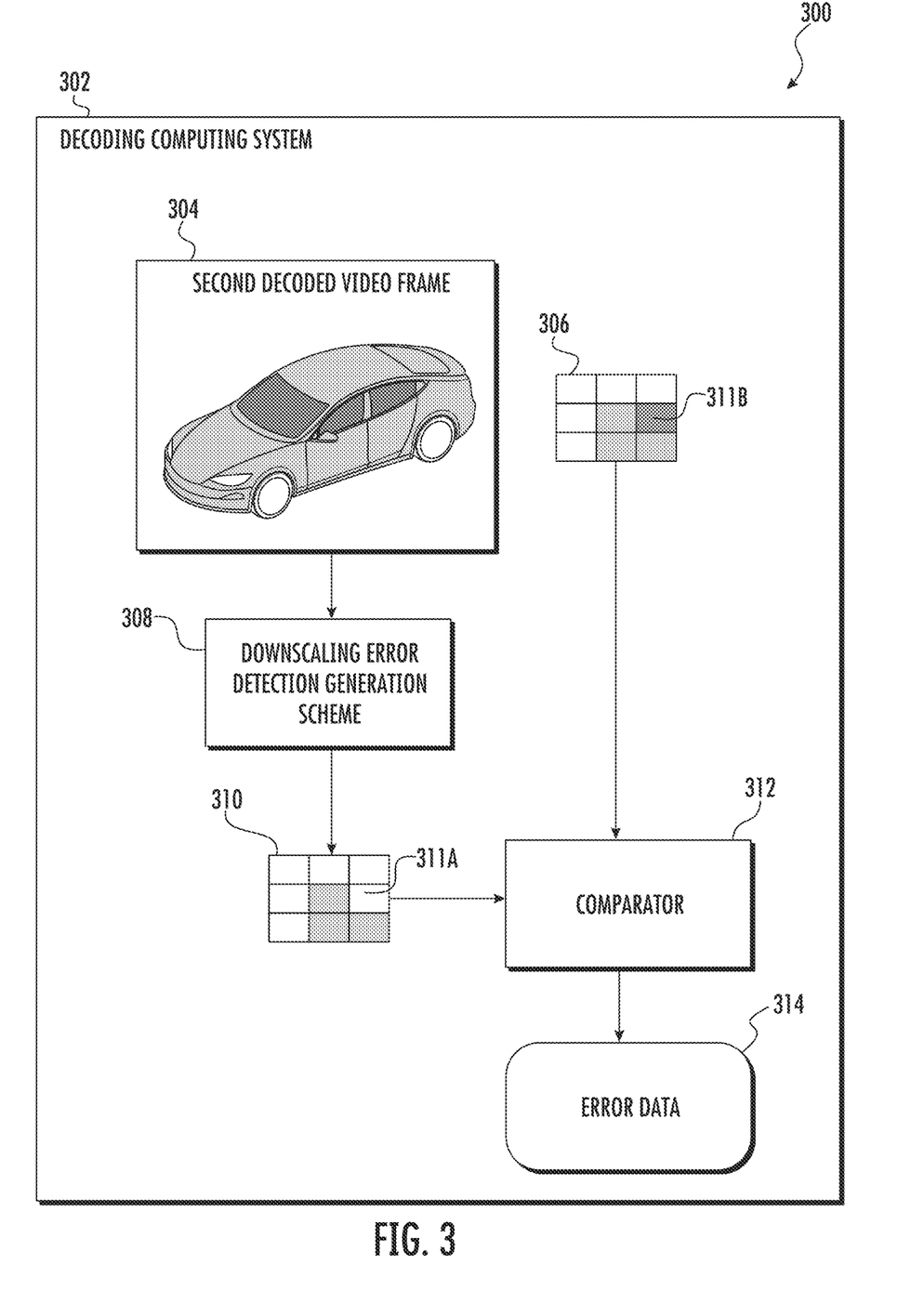
FIG. 3 depicts a flow diagram for downscaling a decoded video frame to obtain an error detection code according to example embodiments of the present disclosure.

FIG. 3 depicts a flow diagram 300 for downscaling a decoded video frame to obtain an error detection code according to example embodiments of the present disclosure. Decoding computing system 302 can receive an encoded video frame and an associated first error detection code 306. The decoding computing system 302 can decode the encoded video frame to produce second decoded video frame 304. These operations can be performed as described with regards to FIG. 3.

The decoding computing system 302 can apply a downscaling error detection code generation scheme 308 to the second decoded video frame 304 to generate a second error detection code 310. The downscaling error detection code generation scheme 308 can be utilized to downscale the second decoded video frame 304 to a small-format representation 310 (e.g., the second error detection code 310 (e.g., downscaling a 1920×1080 pixel representation to a 16×16 pixel representation, etc.). It should be noted that any sort of deterministic algorithm can be used to generate the error detection codes 306/310 (e.g. a perceptual hashing algorithm, a downscaling error detection code generation scheme, etc.). Additionally, the first error detection code 306 can be a downscaled representation of a first decoded video frame.

The decoding computing system 302 can compare the error detection codes 306/310 to determine one or more differences via comparator 312. More particularly, the decoding computing system 302 can compare the pixels of the error detection codes 306/310 to determine one or more differences. As depicted, the first error detection code 306 includes a pixel of a certain color at pixel location 311B. However, the second error detection code 310 lacks the same pixel at pixel location 311A. A comparison between the pixel locations 311A/311B can be used to determine a difference between the two. In turn, error data 314 can be generated that includes the difference between the pixel locations 311A/311B. Further, the error data 314 can, in some implementations, indicate the location of the error (e.g., pixel locations 311A/311B), and/or a number of pixels in the second decoded video frame 304 that are associated with pixel locations 311A/311B.

Figure 4A:
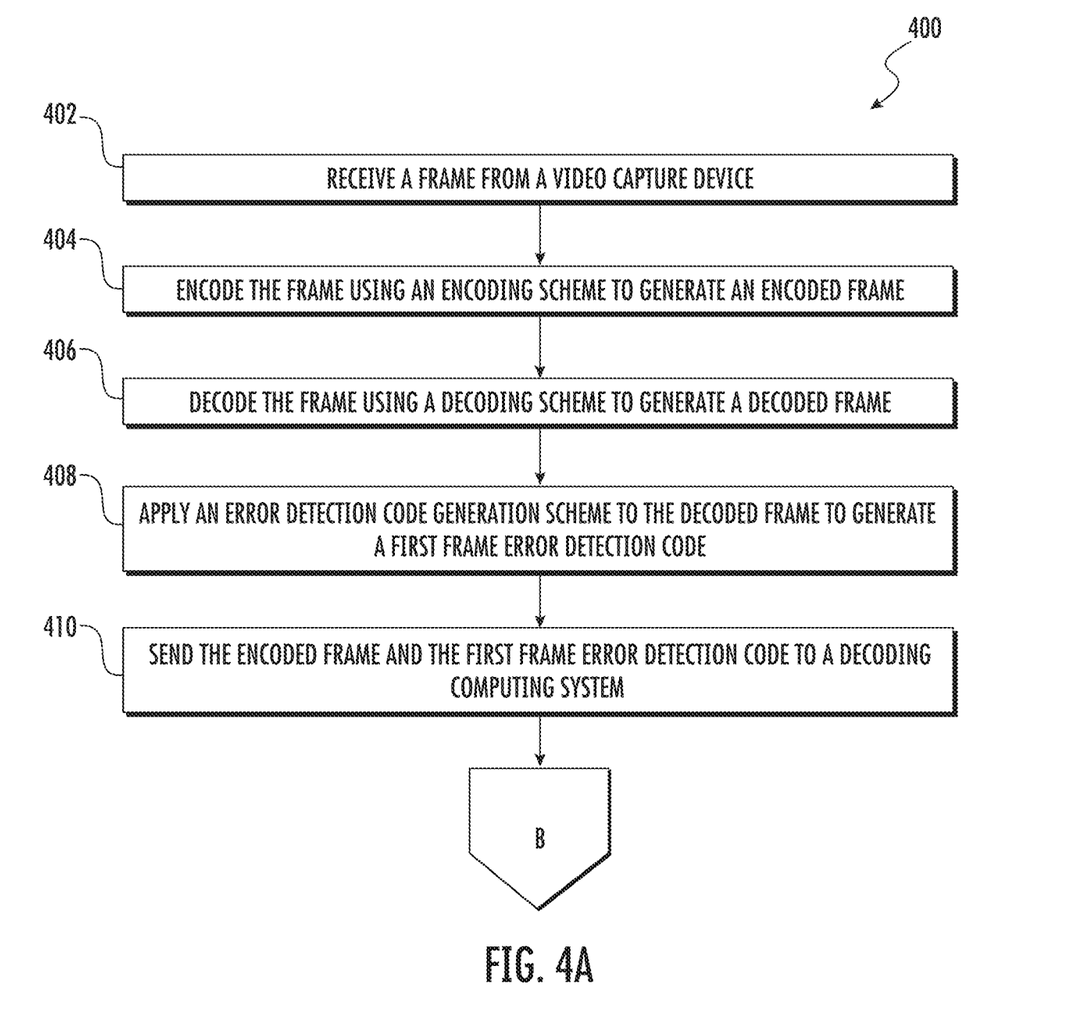
FIG. 4A is a flowchart depicting an example method of generating and sending an encoded video frame and an associated first frame error detection code in accordance with example embodiments of the present disclosure.

FIG. 4A depicts a flow chart diagram of an example method of detecting corruption errors in an encoded video frame based on error detection codes in accordance with example embodiments of the present disclosure. Although FIG. 4 depicts steps performed in a particular order for purposes of illustration and discussion, the methods of the present disclosure are not limited to the particularly illustrated order or arrangement. The various steps of the method 400 can be omitted, rearranged, combined, and/or adapted in various ways without deviating from the scope of the present disclosure.

At 402, the method 400 can include receiving a frame from a video capture device. More particularly, an encoding computing system can receive a video frame from a video frame capture device (e.g., a camera, webcam, associated capture device, etc.). The video frame can, in some implementations, be one video frame of a plurality of video frames captured by the video frame capture device. Alternatively, or additionally, in some implementations, the video frame can include a plurality of video frames.

It should be noted that the process depicted in the encoding computing system can, in some implementations, be performed in parallel for multiple different image frames at multiple different image resolutions. As an example, multiple captured frame data can be processed to generate encoded video frames and associated error detection codes in parallel. In some implementations, each of the multiple encoded video frames and associated error detection codes can be packetized into one or more transmission packages (e.g., packetized by a packetizer into a real-time transportation protocol package, etc.).

At 404, the method 400 can include encoding the frame using an encoding scheme to generate an encoded frame. More particularly, the encoding computing system can encode the video frame according to an encoding scheme to produce a first encoded video frame. The encoding scheme can be any arbitrary video encoding scheme (e.g., MPEG, AVI, etc.). In some implementations, the first encoded video frame can be a compressed representation of the video frame.

At 406, the method 400 can include decoding the frame using a decoding scheme to generate a decoded frame. More particularly, the encoding computing system can decode the encoded video frame according to a decoding scheme corresponding to the encoding scheme to obtain a first decoded video frame. More particularly, the encoding computing system can decode the encoded frame to generate a first decoded video frame that is a decoded representation of the video frame. In some implementations, if the encoding scheme is a lossy encoding scheme, the decoded video frame may differ from the video frame (e.g., artifacting from the lossy compression scheme, etc.).

At 408, the method 400 can include applying an error detection code generation scheme to the decoded frame to generate a first frame error detection code. More particularly, the encoding computing system can apply an error detection code generation scheme to the first decoded video frame to generate a first frame error detection code. The error detection code generation scheme can be any arbitrary hashing and/or checksum scheme. As an example, the error detection code generation scheme may be or otherwise include a conventional checksum generation scheme, such as CRC, Fletcher's checksum, Adler-32, etc. Alternatively, in some implementations, the error detection code generation scheme can be another form of hashing operation, such as a perceptual hashing algorithm. As an example, a downscaling perceptual hashing algorithm can be applied to the first decoded video frame. For example, a first decoded video frame can be downscaled to a very small representation using a deterministic perceptual hashing algorithm (e.g., downscaling a 1920×1080 pixels to a 16×16 pixel representation, etc.). The downscaled decoded video frame can be utilized as a first frame error detection code.

By applying the error detection code generation scheme to the decoded video frame, the encoding computing system can generate a first frame error detection code. The code can be any sort of code specified by the error detection code generation scheme. As an example, if the error detection code generation scheme is a conventional checksum hashing algorithm, the first frame error detection code may be or otherwise include a discrete string of values. Alternatively, if the error detection code generation scheme is a perceptual hashing algorithm, the frame error detection code may be a downscaled representation of the decoded video frame.

Alternatively, in some implementations, the encoding computing system can forego the decoding of the encoded video frame to generate the decoded video frame. Instead, the encoding computing system can generate intermediate encoding data. More particularly, the encoding computing system can perform the encoding scheme to the video frame to generate the encoded video frame. During performance of the encoding scheme, intermediate encoding data can be extracted that is analogous to or descriptive of the decoded video frame. The intermediate encoding data can be used in place of the decoded video frame to generate the first frame error detection code. In such fashion, the encoding computing system can generate both the encoded video frame and the first frame error detection code without ever decoding the encoded video frame, saving significant processing resources and time.

At 410, the method 400 can include sending the encoded frame and the first frame error detection code to a decoding computing system. More particularly, the encoding computing system can send the first encoded video frame and the first frame error detection code to a decoding computing system. In some implementations, the encoding computing system can send the first encoded video frame and the first frame error detection code to the decoding computing system via a network (e.g., internet, local area network, etc.). In some implementations, the first frame error detection code and the first encoded video frame can be sent to the decoding computing system using a real-time transport protocol. As an example, the first encoded video frame can be packaged as one or more real-time transport protocol packets, while the first frame error detection code can be packaged in the extension fields of the one or more real-time transport protocol packets. In such fashion, the first encoded video frame and the first frame error detection code can arrive at the decoding computing system concurrently.

In some implementations, the first frame error detection code can be sent via a packetizer. The packetizer can be any sort of arbitrary hardware and/or software packetizer. As an example, the packetizer can be a physical hardware packetizer integrated into or communicatively coupled to the encoding computing system. As another example, the packetizer may be a virtualized packetizer executed by one or more processors of the encoding computing system (e.g., the processors 112 of FIG. 1). It should be noted that in some implementations, the packetizer can be or include an additional multiplexer with different functionality. As an example, a multiplexer of the packetizer can be configured to replace a first video frame with a second video frame at a different resolution, as described previously. Further, a multiplexer of the packetizer can be utilized to multiplex the first frame error detection code and the encoded video frame. In such fashion, the encoding computing system can utilize any configuration and/or number of physical and/or virtualized packetizer(s) and/or multiplexer(s) to perform the described functionality of the present embodiments.

The packetizer can receive the encoded video frame and the first frame error detection code. The packetizer can package the encoded video frame and the first frame error detection code and transmit both over a network. More particularly, in some implementations, the packetizer can package the encoded video frame and the first frame error detection code as a real-time transportation protocol package. The real-time transportation protocol package can include one or more real-time transportation protocol packets, and the real-time transportation protocol package can include the encoded video frame. Additionally, the first frame error detection code can be included in an extension field of the real-time transportation protocol package. Alternatively, in some implementations, the transmission package can utilize any other sort of transmission protocol when sending the transmission package via the network.

The encoding computing system, using the packetizer, can send the encoded video frame and the first frame error detection code (e.g., packaged in a transmission package, etc.) to a decoding computing system. The decoding computing system can receive the encoded video frame and the first frame error detection code via the network.

Figure 4B:
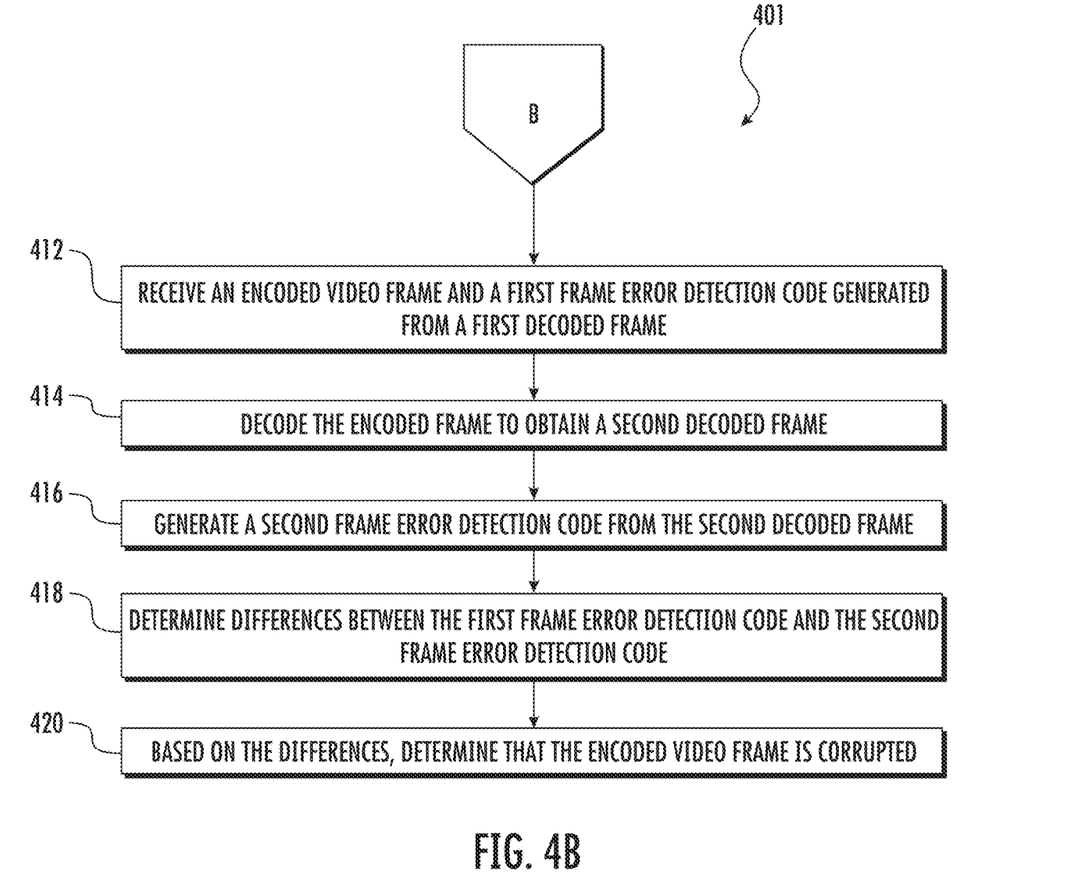
FIG. 4B is a flowchart depicting an example method of detecting corruption errors in an encoded video frame based on error detection codes in accordance with example embodiments of the present disclosure.

FIG. 4B depicts a flow chart diagram of an example method 401 to perform according to example embodiments of the present disclosure. Although FIG. 4B depicts steps performed in a particular order for purposes of illustration and discussion, the methods of the present disclosure are not limited to the particularly illustrated order or arrangement. The various steps of the method 401 can be omitted, rearranged, combined, and/or adapted in various ways without deviating from the scope of the present disclosure. Further, in some implementations, the method 400 of FIG. 4A and the method 401 of FIG. 4B can be rearranged, combined, and/or adapted in various ways without deviating from the scope of the present disclosure.

At 412, the method 401 can include receiving an encoded video frame and a first frame error detection code generated from a first decoded frame. More particularly, the decoding computing system can receive the first encoded video frame and the first frame error detection code. In some implementations, the decoding computing system can be received in a transmission package from an encoding computing system. In some implementations, the decoding computing system can receive the encoded video frame and the first frame error detection code via the network and can use a packetizer to separate the encoded video frame and the first frame error detection code.

At 414, the method 401 can include decoding the encoded frame to obtain a second decoded frame. More particularly, the decoding computing system can, using the same or a substantially similar encoding and/or decoding scheme as the encoding computing system of FIG. 4A, decode the first encoded video frame to obtain a second decoded video frame. In some implementations, the second decoded video frame can be identical or substantially similar to the first decoded video frame generated at the encoding computing system. Alternatively, in some implementations, the second decoded video frame can differ substantially from the first encoded video frame (e.g., due to data corruption, etc.).

At 416, the method 401 can include generating a second frame error detection code from the second decoded frame. More particularly, the decoding computing system can determine error data describing one or more differences between the first frame error detection code and the second frame error detection code. The decoding computing system can determine error data by evaluating a difference by comparing the first frame error detection code and the second frame error detection code. As mentioned previously, if the first and second frame error detection codes are respectively generated by downscaling the first and second decoded video frames, the error detection codes can be compared to determine a spatial location of one or more corruption errors visibly present in the second decoded video frame. As such, the error data can, in some implementations, include a location of one or more errors in the second decoded video frame. Additionally, or alternatively, in some implementations, the error data can include a number of pixels associated with an error. As an example, a comparison of the first and second frame error detection codes can determine that a difference exists in the top-left location of the first and second decoded video frames. The error data can include this location and can also include a number of pixels associated with the difference between the decoded video frames.

At 418, the method 401 can include determining differences between the first frame error detection code and the second frame error detection code. More particularly, the decoding computing system can determine error data describing one or more differences between the first frame error detection code and the second frame error detection code. The decoding computing system can determine error data by evaluating a difference by comparing the first frame error detection code and the second frame error detection code. As mentioned previously, if the first and second frame error detection codes are respectively generated by downscaling the first and second decoded video frames, the error detection codes can be compared to determine a spatial location of one or more corruptions visibly present in the second decoded video frame. As such, the error data can, in some implementations, include a location of one or more errors in the second decoded video frame. Additionally, or alternatively, in some implementations, the error data can include a number of pixels associated with an error. As an example, a comparison of the first and second frame error detection codes can determine that a difference exists in the top-left location of the first and second decoded video frames. The error data can include this location and can also include a number of pixels associated with the difference between the decoded video frames.

At 420, the method 401 can include determining, based on the error data, that the encoded video frame is corrupted. More particularly, the decoding computing system can determine, based on the error data exceeding one or more error thresholds, that the encoded video frame is a corrupted video frame. The decoding computing system can determine that there are a number and/or severity of error(s) associated with the differences between the first and second video frame such that the encoded video frame is corrupted. As an example, an error threshold may specify that exceeding a certain number of errors indicates that the encoded video frame is corrupted. As another example, the error threshold may specify that exceeding a certain number of pixel differences indicates that the encoded video frame is corrupted. The error threshold can be any arbitrary threshold associated with a severity and/or number of errors in the encoded video frame.

Figure 5:
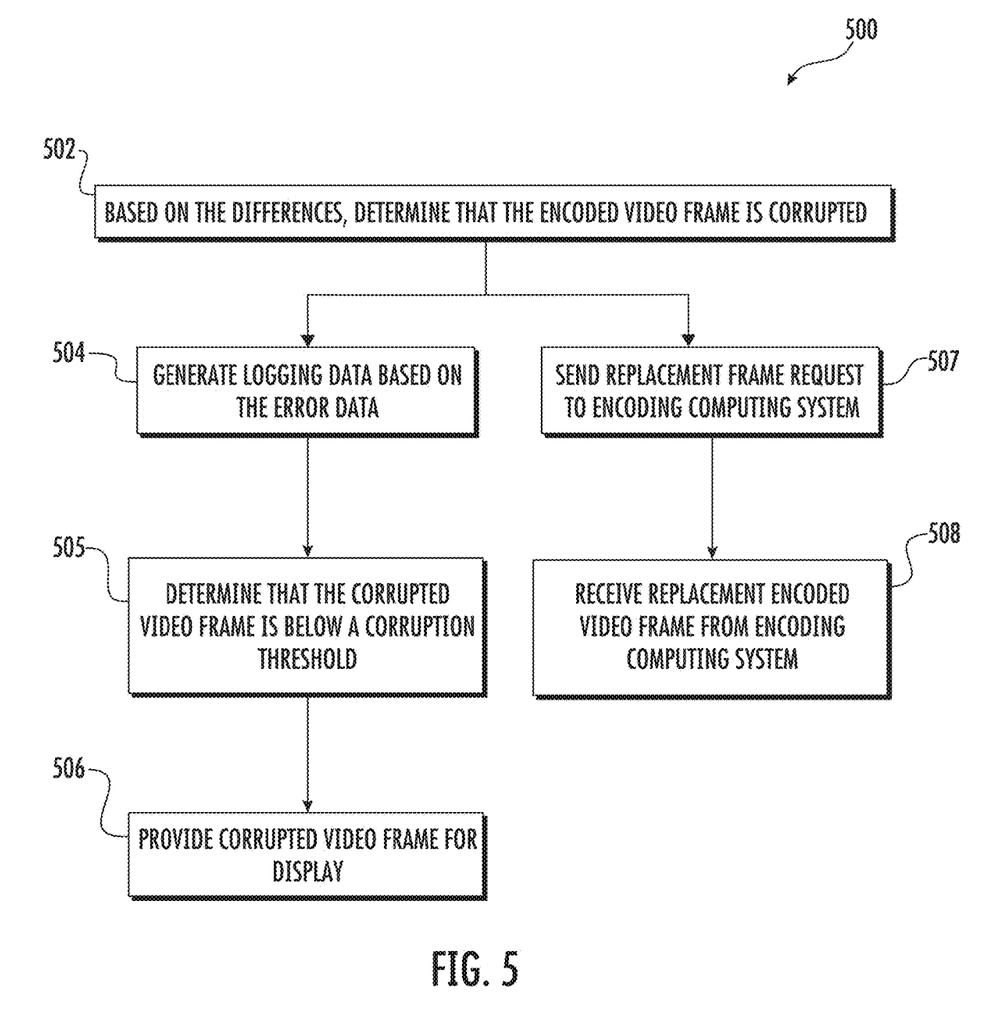
FIG. 5 is a flowchart depicting an example method of performing operations in response to the detection of a corrupted video frame in accordance with example embodiments of the present disclosure.

FIG. 5 depicts a flow chart diagram of an example method of performing operations in response to the detection of a corrupted video frame in accordance with example embodiments of the present disclosure. Although FIG. 5 depicts steps performed in a particular order for purposes of illustration and discussion, the methods of the present disclosure are not limited to the particularly illustrated order or arrangement. The various steps of the method 500 can be omitted, rearranged, combined, and/or adapted in various ways without deviating from the scope of the present disclosure.

At 502, the method 500 can include determining, based on the error data, that the encoded video frame is corrupted. More particularly, a decoding computing system can determine, based on the error data exceeding one or more error thresholds, that an encoded video frame is a corrupted video frame. The decoding computing system can determine that there are a number and/or severity of error(s) associated with the differences between a first and second video frame such that the encoded video frame is corrupted. As an example, an error threshold may specify that exceeding a certain number of errors indicates that the encoded video frame is corrupted. As another example, the error threshold may specify that exceeding a certain number of pixel differences indicates that the encoded video frame is corrupted. The error threshold can be any arbitrary threshold associated with a severity and/or number of errors in the encoded video frame.

At 504, the method can include generating logging data based on the error data. More particularly, in response to determining that the encoded video frame is a corrupted video frame, the decoding computing system can generate logging data. The logging data can include the corrupted video frame, the second decoded video frame, metadata associated with the corrupted video frame, the error data describing the one or more differences, or any other arbitrary data associated with the video frame data. Additionally, or alternatively, in some implementations, the decoding computing system can generate a logging request and send the logging request to the encoding computing system. The logging request can include instructions to generate logging data that includes the same or similar data as the logging data generated by the decoding computing system.

At 505, method 500 can include determining that the corrupted video frame is below a corruption threshold. The corruption threshold can describe a threshold level of corruption associated with the corrupted video frame.

At 506, the method 500 can include providing the corrupted video frame for display. More particularly, in response to determining that the corrupted video frame is below a corruption threshold, the decoding computing system can provide the corrupted video frame for display on a display device. The display device can be integrated with or communicatively coupled to the decoding computing system, or can alternatively be located at a separate computing system.

Alternatively, or additionally, at 507 the method 500 can include sending a replacement frame request to an encoding computing system. It should be noted that, as depicted, the method 500 allows for the generation of logging data based on the error data (e.g., 504), the determination that the corrupted video frame is below a corruption threshold (e.g., 505), and the provision of the corrupted video frame for display (e.g., 506) in addition to the sending of a replacement frame request to the encoding computing system (e.g., 507), and the receipt of a replacement encoded video frame from the encoding computing system 508. However, these steps are not required to occur sequentially or at all.

At 508, the method 500 can include receiving a replacement encoded video frame from an encoding computing system. In response, the decoding computing system can receive a replacement encoded video frame from the encoding computing system. The replacement encoded video frame can be a re-encoding of the video frame from the captured frame data. In some implementations, the replacement encoded video frame can include a key frame.

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

As an example, the present subject matter can include applying the error detection code generation scheme to the first decoded video frame to generate the first frame error detection code. Applying the error detection code generation scheme can include downscaling the decoded video frame to obtain a downscaled video frame, the downscaled video frame being smaller than the first decoded video frame; and encoding the downscaled video frame to obtain an encoded downscaled video frame, wherein the first frame error detection code comprises the encoded downscaled video frame.

As another example, the present subject matter can include an encoding computing system. The encoding computing system can include one or more processors. The encoding computing system can include one or more tangible, non-transitory, computer readable media that collectively store instructions that when executed by the one or more processors cause the encoding computing system to perform operations. The operations can include receiving a video frame from a video frame capture device. The operations can include encoding the video frame according to an encoding scheme to produce an encoded video frame. The operations can include generating a frame error detection code for the video frame based on intermediate encoding data produced via performance of the encoding scheme. The operations can include sending the encoded video frame and the frame error detection code to a decoding computing system.

What is claimed is:

1. A computer-implemented method for error detection in video data, comprising:
   receiving, by a decoding computing system comprising one or more computing devices, an encoded video frame and an associated first frame error detection code, the first frame error detection code generated by an encoding computing system by applying an error detection code generation scheme to a first decoded video frame, the first decoded video frame comprising a decoding of the encoded video frame produced at the encoding computing system;
   decoding, by the decoding computing system, the encoded video frame to obtain a second decoded video frame;
   applying, by the decoding computing system, the error detection code generation scheme to the second decoded video frame to generate a second frame error detection code;
   determining, by the decoding computing system, error data describing one or more differences between the first frame error detection code and the second frame error detection code;
   determining, by the decoding computing system based on the error data exceeding one or more error thresholds, that the encoded video frame is a corrupted video frame; and
   in response to the determination that the encoded video frame is a corrupted video frame, sending, by the decoding computing system, a replacement frame request to the encoding computing system, wherein the replacement frame request requests a replacement encoded video frame for the encoded video frame.

2. The computer-implemented method of claim 1, wherein the encoded video frame is received in a real-time transport protocol packet and the first frame error detection code is included in an extension field of the real-time transport protocol packet.

3. The computer-implemented method of claim 1, wherein the method further comprises, in response to determining, by the decoding computing system, that the encoded video frame is a corrupted video frame:
   generating, by the decoding computing system, logging data that comprises at least one of: the corrupted video frame, metadata associated with the corrupted video frame, or the error data describing the one or more differences.

4. The computer-implemented method of claim 3, wherein the logging data further comprises one or more preceding encoded video frames received from the encoding computing system prior to receipt of the encoded video frame.

5. The computer-implemented method of claim 3, wherein the method further comprises sending, by the decoding computing system, logging request data to the encoding computing system, the logging request data comprising instructions to generate logging data including at least a video frame corresponding to the corrupted video frame.

6. The computer-implemented method of claim 1, wherein the method further comprises receiving, by the decoding computing system from the encoding computing system, the replacement encoded video frame, the replacement encoded video frame configured to replace the encoded video frame.

7. The computer-implemented method of claim 1, wherein the replacement encoded video frame comprises a key frame.

8. The computer-implemented method of claim 1, wherein applying, by the decoding computing system, the error detection code generation scheme to the second decoded video frame to generate the second frame error detection code comprises:
   downscaling, by the decoding computing system, the second decoded video frame to obtain a downscaled second video frame, the downscaled second video frame being smaller than the second decoded video frame; and
   encoding, by the decoding computing system, the downscaled second video frame to obtain an encoded downscaled second video frame, wherein the second frame error detection code comprises the encoded downscaled second video frame.

9. The computer-implemented method of claim 8, wherein:
   the first frame error detection code comprises an encoded downscaled first video frame, wherein the encoded downscaled first video frame has been downscaled to the size of the second frame error detection code; and
   determining, by the decoding computing system, the error data describing the one or more differences between the first frame error detection code and the second frame error detection code comprises comparing, by the decoding computing system, a plurality of first pixels of the first frame error detection code and a plurality of second pixels of the second frame error detection code to determine the one or more differences at one or more spatial locations of the first frame error detection code and the second frame error detection code.

10. The computer-implemented method of claim 8, wherein the encoded downscaled first video frame and the encoded downscaled second video frame are respectively downscaled through performance of a deterministic downscaling algorithm.

11. The computer-implemented method of claim 1, wherein the method further comprises:
   determining, by the decoding computing system, that the corrupted video frame is below a corruption threshold; and
   providing, by the decoding computing system, the corrupted video frame for display.

12. An encoding computing system, comprising:
one or more processors; and
one or more tangible, non-transitory, computer readable media that collectively store instructions that when executed by the one or more processors cause the encoding computing system to perform operations, the operations comprising:
   receiving a video frame from a video frame capture device;
   encoding the video frame according to an encoding scheme to produce an encoded video frame;
   decoding the encoded video frame according to a decoding scheme corresponding to the encoding scheme to obtain a decoded video frame;
   applying an error detection code generation scheme to the decoded video frame to generate a frame error detection code;
   sending the encoded video frame and the frame error detection code to a decoding computing system;
   receiving a replacement frame request from the decoding computing system;
   in response to the replacement frame request:
      generating a replacement encoded video frame by encoding the video frame according to the encoding scheme to produce the replacement encoded video frame; and
      sending the replacement encoded video frame to the decoding computing system.

13. The encoding computing system of claim 12, wherein sending the encoded video frame and the frame error detection code to the decoding computing system comprises:
   packaging the encoded video frame and the frame error detection code in a transmission package; and
   sending the transmission package to the decoding computing system.

14. The encoding computing system of claim 12, wherein the operations further comprise receiving, from the decoding computing system, logging request data, the logging request data comprising instructions to generate logging data including at least the video frame.

15. The encoding computing system of claim 12, wherein:
   the video frame is captured by the video frame capture device at a first resolution; and
   receiving the video frame from the video frame capture device further comprises:
      scaling the video frame to a second resolution to obtain a second video frame; and
      replacing the video frame with the second video frame.

16. The encoding computing system of claim 12, wherein:
   generating the replacement encoded video frame further comprises:
      decoding the replacement encoded video frame according to the decoding scheme corresponding to the encoding scheme to obtain a replacement decoded video frame;
      applying the error detection code generation scheme to the replacement decoded video frame to generate a replacement frame error detection code; and
   sending the replacement encoded frame to the decoding computing system further comprises sending the replacement frame error detection code to the decoding computing system.

17. The encoding computing system of claim 12, wherein applying the error detection code generation scheme to the decoded video frame to generate the frame error detection code comprises:
   downscaling the decoded video frame to obtain a downscaled video frame, the downscaled video frame being smaller than the decoded video frame; and
   encoding the downscaled video frame to obtain an encoded downscaled video frame, wherein the frame error detection code comprises the encoded downscaled video frame.

18. One or more tangible, non-transitory computer readable media storing computer-readable instructions that when executed by one or more processors cause the one or more processors to perform operations, the operations comprising:

receiving a video frame from a video frame capture device;

encoding the video frame according to an encoding scheme to produce a first encoded video frame;

decoding the first encoded video frame according to a decoding scheme corresponding to the encoding scheme to obtain a first decoded video frame;

applying an error detection code generation scheme to the first decoded video frame to generate a first frame error detection code;

decoding the encoded video frame according to the decoding scheme corresponding to the encoding scheme to obtain a second decoded video frame;

applying the error detection code generation scheme to the second decoded video frame to generate a second frame error detection code;

determining error data describing one or more differences between the first frame error detection code and the second frame error detection code;

determining, based on the error data exceeding one or more error thresholds, that the encoded video frame is a corrupted video frame; and in response to the determination that the encoded video frame is a corrupted video frame, sending a replacement frame request to the video frame capture device, wherein the replacement frame request requests a replacement encoded video frame for the encoded video frame.

* * * * *